United States Patent
Lin et al.

(10) Patent No.: US 9,966,363 B1
(45) Date of Patent: May 8, 2018

(54) SEMICONDUCTOR APPARATUS AND METHOD FOR PREPARING THE SAME

(71) Applicant: NANYA TECHNOLOGY CORPORATION, Taoyuan (TW)

(72) Inventors: Po-Chun Lin, Changhua (TW); Chin-Lung Chu, Taoyuan (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days. days.

(21) Appl. No.: 15/423,973

(22) Filed: Feb. 3, 2017

(51) Int. Cl.
*H01L 25/065* (2006.01)
*H01L 23/48* (2006.01)
*H01L 23/00* (2006.01)
*H01L 23/498* (2006.01)
*H01L 25/00* (2006.01)

(52) U.S. Cl.
CPC ........ *H01L 25/0657* (2013.01); *H01L 23/481* (2013.01); *H01L 23/49838* (2013.01); *H01L 24/16* (2013.01); *H01L 25/50* (2013.01); *H01L 2224/16227* (2013.01); *H01L 2225/06513* (2013.01); *H01L 2225/06544* (2013.01); *H01L 2225/06562* (2013.01); *H01L 2225/06565* (2013.01)

(58) Field of Classification Search
CPC ................. H01L 25/0657; H01L 25/50; H01L 23/49838; H01L 24/16; H01L 23/481; H01L 2224/16227; H01L 2225/06565; H01L 2225/06562; H01L 2225/06544; H01L 2225/06513
USPC ........................................ 257/621, 723, 777
See application file for complete search history.

(56) References Cited

U.S. PATENT DOCUMENTS

| | | |
|---|---|---|
| 6,448,661 B1 | 9/2002 | Kim et al. |
| 2005/0289269 A1 | 12/2005 | Nakayama et al. |
| 2006/0249839 A1* | 11/2006 | Yoshida ............ H01L 23/49575 257/723 |

* cited by examiner

*Primary Examiner* — Caleen Sullivan
(74) *Attorney, Agent, or Firm* — Muncy, Geissler, Olds & Lowe, P.C.

(57) ABSTRACT

A semiconductor apparatus includes a first semiconductor die and a second semiconductor die stacked onto the first semiconductor die in a horizontally shifted manner. The first semiconductor die includes a first chip selection terminal and a first lower terminal electrically connected to the first chip selection terminal. The second semiconductor die includes a second chip selection terminal electrically connected to a first upper terminal of the first semiconductor die via a second lower terminal of the second semiconductor die. The first upper terminal which is electrically connected to the second chip selection terminal is not electrically connected to the first lower terminal which is electrically connected to the first chip selection terminal.

18 Claims, 15 Drawing Sheets

SEMICONDUCTOR APPARATUS AND METHOD FOR PREPARING THE SAME

TECHNICAL FIELD

The present disclosure relates to a semiconductor apparatus and a method for preparing the same, and particularly relates to a semiconductor apparatus having a plurality of horizontally-shifted semiconductor dies and a method for preparing the same.

DISCUSSION OF THE BACKGROUND

Chip stacking technology can allow two chips to be arranged more closely together, thereby enabling faster data transmission between the two chips and consuming less power. Memory chips can be stacked together to obtain a memory module with a large storage capacity. In addition to stacking two identical chips, two chips with different functions may also be stacked together to create a combination offering multiple functions.

In a memory chip stack, each memory chip has a chip selection (CS) terminal, which is used to enable the memory chip. For example, a DRAM chip can have a row address strobe (RAS), a column address strobe (CAS), or a chip selection pin (CSP) as a chip selection terminal. When a signal is applied to the chip selection terminal of a chip in a memory chip stack, the chip can be accessed, while other chips in the stack cannot be accessed.

Conventionally, signals applied to the chip selection terminals of the memory chip stack will flow through wires. Such wires require additional processes to form, with increasing risk of signal trace shortage when producing increasingly finely-pitched products. Moreover, long wires cause signal delays by occupying more space, and result in greater chip package size.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor apparatus comprising a first semiconductor die; a second semiconductor die stacked onto the first semiconductor die in a horizontally shifted manner; wherein the first semiconductor die comprises a first chip selection terminal and a first lower terminal electrically connected to the first chip selection terminal; and wherein the second semiconductor die comprises a second chip selection terminal electrically connected to a first upper terminal of the first semiconductor die via a second lower terminal of the second semiconductor die, and the first upper terminal, which is electrically connected to the second chip selection terminal, is not electrically connected to the first lower terminal, which is electrically connected to the first chip selection terminal.

In some embodiments, the first semiconductor die comprises a plurality of first upper terminals, a plurality of first lower terminals and a plurality of first connection plugs electrically connecting the first upper terminals and the first lower terminals; and the second semiconductor die comprises a plurality of second upper terminals, a plurality of second lower terminals and a plurality of second connection plugs electrically connecting the second upper terminals and the second lower terminals.

In some embodiments, the first semiconductor die comprises a first chip selection plug electrically connecting the first chip selection terminal and one of the first lower terminals.

In some embodiments, the first chip selection plug is neither aligned with nor electrically connected to any of the second connection plugs of the second semiconductor die.

In some embodiments, the second semiconductor die comprises a second chip selection plug electrically connecting the second chip selection terminal and one of the second lower terminals.

In some embodiments, the second chip selection plug is aligned with and electrically connected to one of the first connection plugs of the first semiconductor die.

In some embodiments, the first semiconductor die comprises a substrate, the first chip selection terminal is disposed over the substrate, and the first chip selection plug penetrates the substrate to contact one of the first lower terminals.

In some embodiments, the first semiconductor die comprises a substrate and a circuit portion, the first chip selection plug penetrates the substrate, and the first connection plugs penetrate the substrate and the circuit portion.

In some embodiments, the first semiconductor die comprises a substrate, the first chip selection terminal is disposed below the substrate, and the first chip selection plug contacts one of the first lower terminals without extending into the substrate.

In some embodiments, the first semiconductor die comprises a substrate and a circuit portion, the first chip selection plug does not extend into the substrate, and the first connection plugs penetrate the substrate and the circuit portion.

In some embodiments, the first connection plug is aligned with and electrically connected to the second connection plug directly above the first connection plug.

In some embodiments, at least one of second lower terminals is not electrically connected to any of the first upper terminals.

In some embodiments, the number of first upper terminals is different from the number of first lower terminals.

In some embodiments, the number of first upper terminals is smaller than the number of first lower terminals by at least one.

In some embodiments, the first semiconductor die and the second semiconductor die have the same width, and one side of the second semiconductor die is not aligned with one side of the first semiconductor die.

In some embodiments, the semiconductor apparatus further comprises an object, and the first semiconductor die is attached to the object.

In some embodiments, the object comprises a plurality of contacts, and the first chip selection terminal and the second chip selection terminal are electrically connected to different contacts of the object.

Another aspect of the present disclosure provides a method for preparing a semiconductor apparatus, comprising: preparing a first semiconductor die with a first chip selection terminal, wherein the first semiconductor die comprises a first lower terminal electrically connected to the first chip selection terminals; preparing a second semiconductor die with a second chip selection terminal, wherein the second semiconductor die comprises a second lower terminal electrically connected to the second chip selection terminal; and attaching the second semiconductor die to the first semiconductor die in a horizontally shifted manner; wherein the second lower terminal is electrically connected to a first upper terminal of the first semiconductor die, and the first upper terminal, which is electrically connected to the second chip selection terminal, is not electrically connected to the first lower terminal, which is electrically connected to the first chip selection terminal.

In some embodiments, the method further comprises attaching the first semiconductor die to an object with a plurality of contacts, wherein the first chip selection terminal and the second chip selection terminal are electrically connected to different contacts of the object.

The present disclosure is directed to a semiconductor apparatus having a plurality of horizontally shifted semiconductor dies and a method for preparing the same. The chip selection terminals of the plurality of horizontally shifted semiconductor dies are electrically isolated from each other; consequently, electronic signals can be selectively transmitted to a one of the semiconductor dies, while other semiconductor dies in the semiconductor apparatus cannot be accessed.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor apparatus having a plurality of horizontally shifted semiconductor dies and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
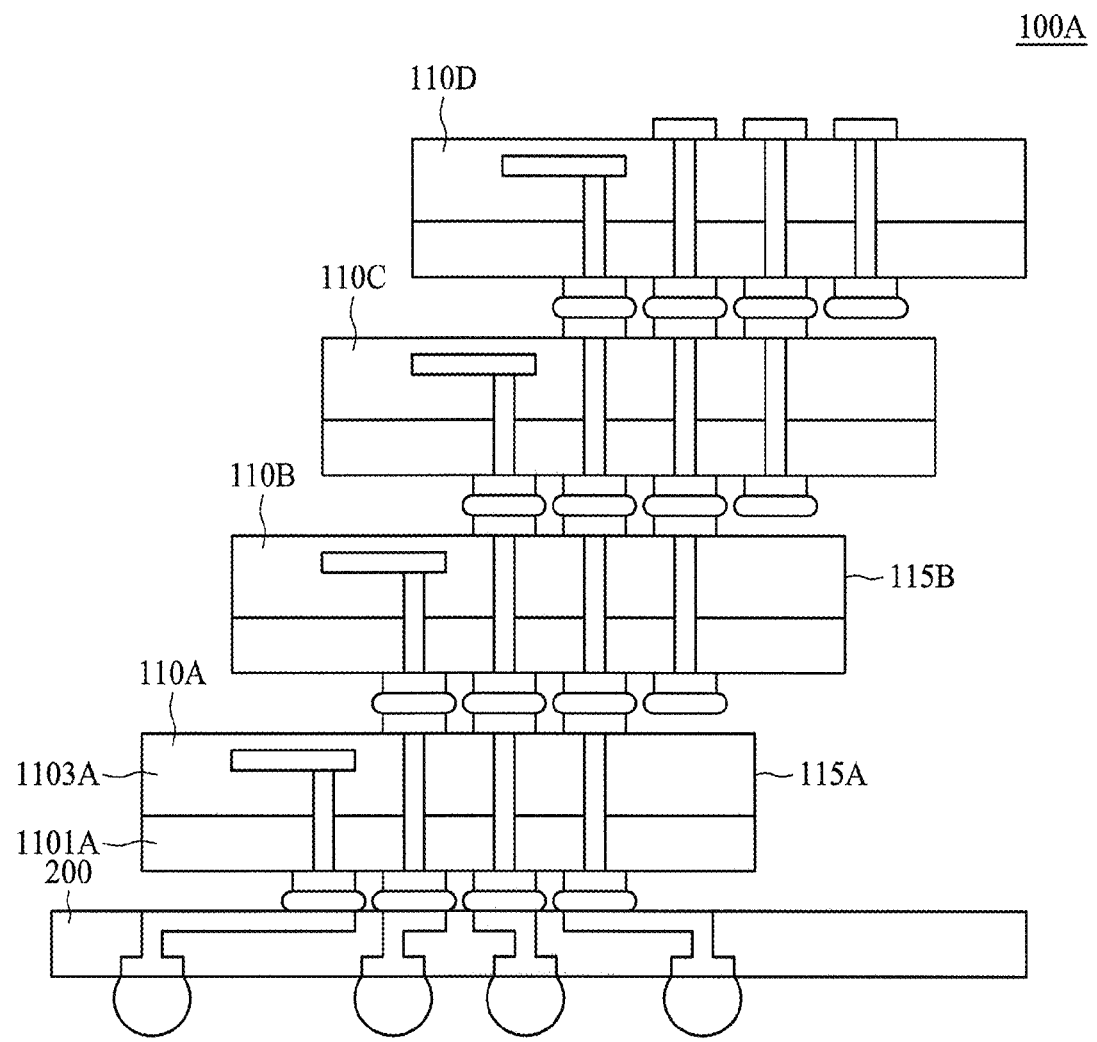
FIG. 1 is a cross-sectional view of a semiconductor apparatus in accordance with some embodiments of the present disclosure.
Figure 2:
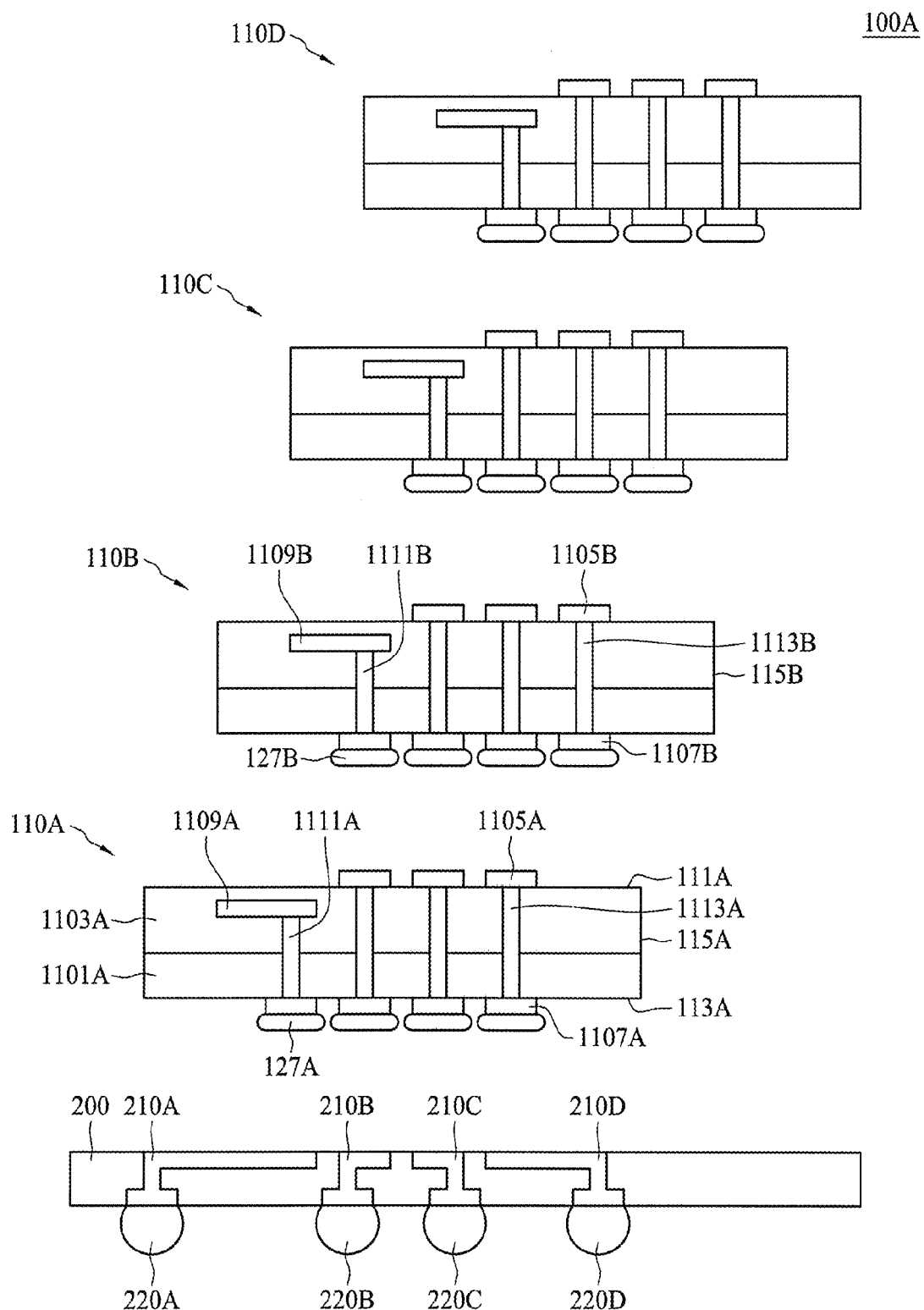
FIG. 2 is a cross-sectional disassembled view of the semiconductor apparatus in FIG. 1.

FIG. 1 is a cross-sectional view of a semiconductor apparatus 100A in accordance with some embodiments of the present disclosure. FIG. 2 is a cross-sectional disassembled view of the semiconductor apparatus 100A in FIG. 1. In some embodiments, the semiconductor apparatus 100A comprises an object 200, a first semiconductor die 110A attached to the object 200, a second semiconductor die 110B attached to the first semiconductor die 110A, a third semiconductor die 110C attached to the second semiconductor die 110B, and a fourth semiconductor die 110D attached to the third semiconductor die 110C.

In some embodiments, the second semiconductor die 110B is stacked onto the first semiconductor die 110A in a horizontally shifted manner. In some embodiments, the second semiconductor die 110B extends laterally across a right side 115A of the first semiconductor die 110A. In some embodiments, the first semiconductor die 110A and the second semiconductor die 110B have the same width, and the right side 115B of the second semiconductor die 110B is not aligned with the right side 115A of the first semiconductor die 110A. In some embodiments, the space below the second semiconductor die 110B and the right side 115A of the first semiconductor die 110A may be used to dispose a device, which may be electrically connected to the object 200 or to the semiconductor dies.

In some embodiments, the first semiconductor die 110A comprises a substrate 1101A; a circuit portion 1103A on the substrate 1101A; a plurality of upper terminals 1105A on an upper surface 111A of the first semiconductor die 110A; a plurality of lower terminals 1107A on the bottom surface 113A of the first semiconductor die 110A; a first chip selection terminal 1109A in the circuit portion 1103A; and a first chip selection plug 1111A electrically connecting the first chip selection terminal 1109A and one of the lower terminals 1107A. In some embodiments, the first semiconductor die 110A further comprises a plurality of connection plugs 1113A electrically connecting the upper terminals 1105A and the lower terminals 1107A.

In some embodiments, the substrate 1101A can be a silicon substrate, a semiconductor-on-insulator (SOI) substrate, or any construction comprising semiconductor materials; and the circuit portion 1103A comprises dielectric material and conductive elements made of, for example, Ti, Al, Ni, nickel vanadium (NiV), Cu, or a Cu alloy. In some embodiments, the first semiconductor die 110A includes integrated circuits (IC) or semiconductor components such as transistors, capacitors, resistors, diodes, photo-diodes, fuses, and the like configured to perform one or more functions, wherein the IC and semiconductor components are not shown for clarity in this illustration.

In some embodiments, the semiconductor dies are integrated circuit dies separated from a wafer. In some embodiments, the semiconductor dies are memory chips such as DRAM chips or flash memory chips. It is well known that a memory chip comprises address input terminals for addressing memory cells, data input/output terminals for inputting and outputting data to and from the memory cells, and power supply terminals.

In some embodiments, the second semiconductor die 110B, the third semiconductor die 110C and the fourth semiconductor die 110D may have substantially the same configuration as the first semiconductor die 110A. In other words, the second semiconductor die 110B comprises a plurality of upper terminals 1105B, a plurality of lower terminals 1107B, a plurality of connection plugs 1113B electrically connecting the upper terminals 1105B and the lower terminals 1107B, a second chip selection terminal 1109B, and a second chip selection plug 1111B electrically connecting the second chip selection terminal 1109B and one of the second lower terminals 1107B.

In some embodiments, some of the connection plugs 1113A (the rightmost two plugs) of the first semiconductor die 110A (the lower semiconductor die) are aligned with and electrically connected to some of the corresponding connection plugs 1113B (the middle two plugs) of the second semiconductor die 110B (the upper semiconductor die). In some embodiments, the second chip selection plug 1111B of the second semiconductor die 110B (the upper semiconductor die) is aligned with and electrically connected to one of the first connection plugs 1113A (the leftmost plug) of the first semiconductor die 110A (the lower semiconductor die).

In some embodiments, the first chip selection terminal 1109A of the first semiconductor die 110A and the second chip selection terminal 1109B of the second semiconductor die 110B are configured to electrically connect gate terminals of MOS transistors in a logic circuit such as the peripheral circuit of a DRAM chip, and the MOS transistor is configured to control whether to allow the propagation of the command instructions from a source terminal to a drain terminal thereof.

In some embodiments, the number of the upper terminals 1105A of the first semiconductor die 110A may be different from the number of the lower terminals 1107A of the first semiconductor die 110A. In some embodiments, the number of the upper terminals 1105A is smaller than the number of the lower terminals 1107A by at least one terminal. In some embodiments, one of the lower terminals 1107B (the rightmost one) of the second semiconductor die 110B is not electrically connected to the upper terminals 1105A of the first semiconductor die 110A.

In some embodiments, the object 200 is a package circuit substrate or silicon/glass interposer having a plurality of contacts 210A, 210B, 210C and 210D. In addition, the package circuit substrate or silicon/glass interposer also has a plurality of solder balls or bumps (such as, for example, copper pillar bumps) 220A, 220B, 220C and 220D respectively attached to the plurality of contacts 210A, 210B, 210C and 210D. In some embodiments, the plurality of lower terminals 1107A of the first semiconductor die 110A is attached respectively to the plurality of contacts 210A, 210B, 210C and 210D of the package circuit substrate 200 via a plurality of metal bumps 127.

In some embodiments, the first chip selection terminal 1109A of the first semiconductor die 110A is electrically connected to the contact 210A of the object 200 via the first chip selection plug 1111A, one of the lower terminals 1107A, and one of the metal bumps 127A between the first semiconductor die 110A and the object 200. In some embodiments, the second chip selection terminal 1109B of the second semiconductor die 110B is electrically connected to one of the upper terminals 1105A of the first semiconductor die 110A via the second chip selection plug 1111B, one of the lower terminals 1107B of the second semiconductor die 110B, and one of the metal bumps 127B between the second semiconductor die 110B and the first semiconductor die 110A.

In addition, the leftmost upper terminal 1105A of the first semiconductor die 110A, which is electrically connected to the second chip selection terminal 1109B of the second semiconductor die 110B, is further electrically connected to the contact 210B of the object 200 via one of the connection plugs 1113A, one of the lower terminals 1107A of the first semiconductor die 110A, and one of the metal bumps 127A. In some embodiments, the upper terminal 1105A (and the corresponding lower terminal 1107A) of the first semiconductor die 110A which is electrically connected to the second chip selection terminal 1109B of the second semiconductor die 110B is not electrically connected to the lower terminal 1107A which is electrically connected to the first chip selection terminal 1109A of the first semiconductor die 110A. Consequently, the second chip selection terminal 1109B is electrically isolated from the first chip selection terminal 1109A.

In some embodiments, electronic signals are selectively transmitted to the second chip selection terminal 1109B of the second semiconductor die 110B via the solder ball 220B, the contact 210B, the connection plug 1113A of the first semiconductor die 110A and the chip selection plug 1111B of the second semiconductor die 110B; consequently, the second semiconductor die 110B is selected for operation and can be accessed, while other, non-selected semiconductor dies cannot be accessed. Similarly, the first semiconductor die 110A can be selected for operation and accessed by selectively transmitting electronic signals via the solder ball 220A, the third semiconductor die 110C can be selected for operation and accessed by selectively transmitting electronic signals via the solder ball 220C, and the fourth semiconductor die 101D can be selected for operation and accessed by selectively transmitting electronic signals via the solder ball 220D.

Figure 3:
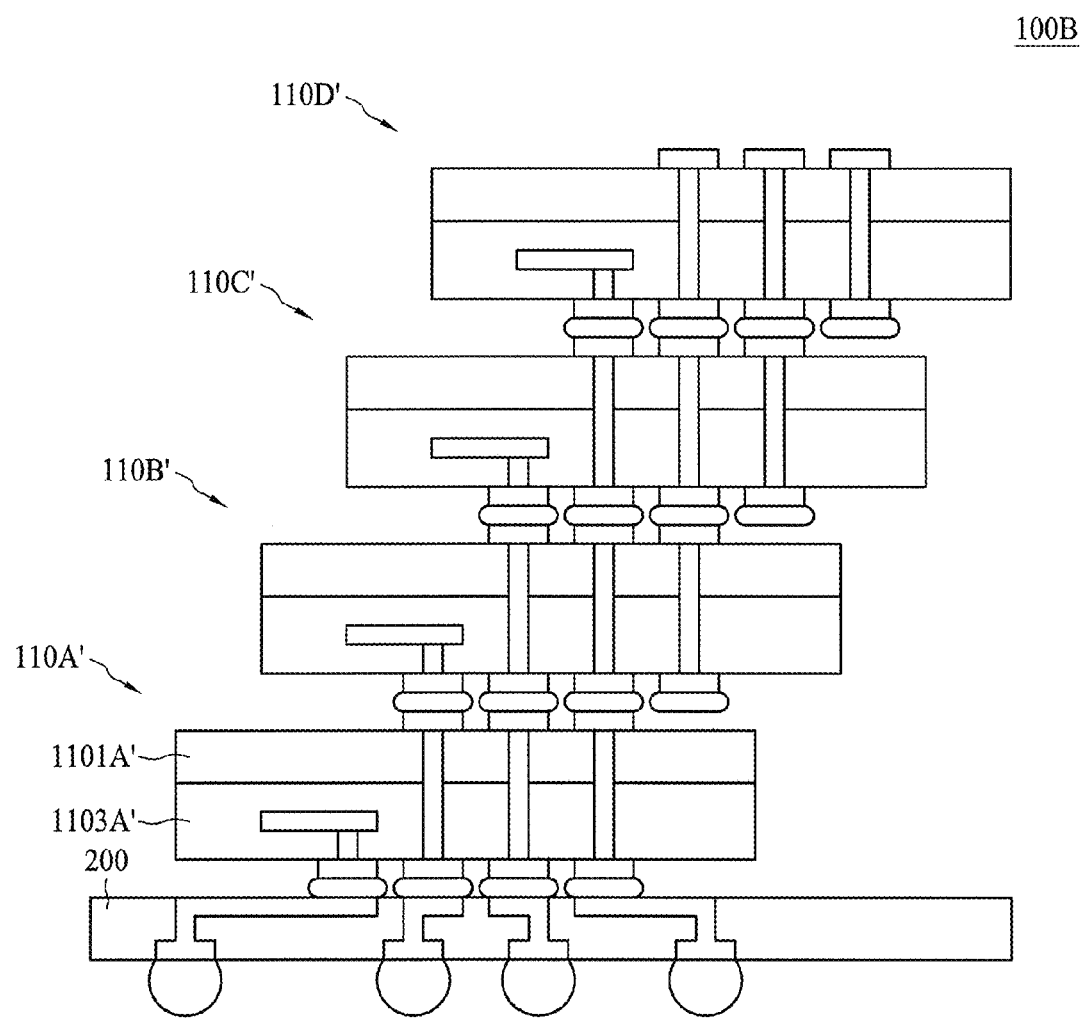
FIG. 3 is a cross-sectional view of a semiconductor apparatus in accordance with some embodiments of the present disclosure.
Figure 4:
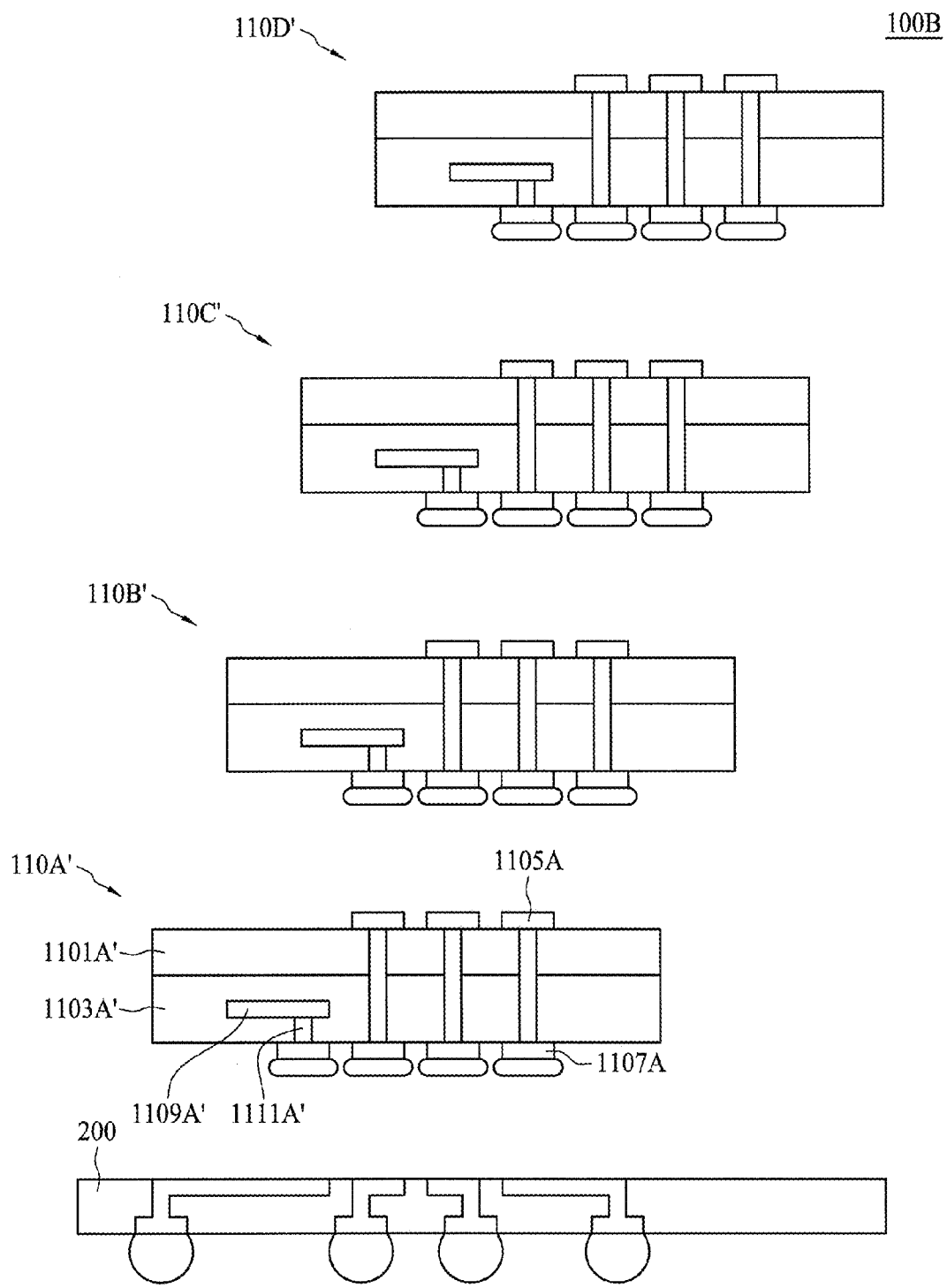
FIG. 4 is a cross-sectional disassembled view of the semiconductor apparatus in FIG. 3.

FIG. 3 is a cross-sectional view of a semiconductor apparatus 100B in accordance with some embodiments of the present disclosure. FIG. 4 is a cross-sectional disassembled view of the semiconductor apparatus 100B in FIG. 3. In some embodiments, the semiconductor apparatus 100B comprises an object 200, a first semiconductor die 110A' attached to the object 200, a second semiconductor die 110B' attached to the first semiconductor die 110A', a third semiconductor die 110C' attached to the second semiconductor die 110B', and a fourth semiconductor die 110D' attached to the third semiconductor die 110C'. In FIG. 1, the semiconductor dies are stacked onto the object 200 in a face-up manner, while the semiconductor dies in FIG. 3 are stacked onto the object 200 in a face-down manner.

In the face-up stacking as shown in FIG. 1 and FIG. 2, the circuit portion 1103A with the first chip selection terminal 1109A is the upper portion of the semiconductor die, the substrate 1101A is the lower portion of the semiconductor die, and the lower portion faces the object 200; wherein the first chip selection plug 1111A penetrates the substrate 1101A to contact the corresponding lower terminal 1107A. In the face-down stacking as shown in FIG. 3 and FIG. 4, the circuit portion 1103A' with the first chip selection terminal 1109A' is the lower portion of the semiconductor die, the substrate 1101A' is the upper portion of the semiconductor die, and the lower portion faces the object 200; wherein the first chip selection plug 1111A' contacts the corresponding lower terminal 1107A without extending into the substrate 1101A'.

Figure 5:
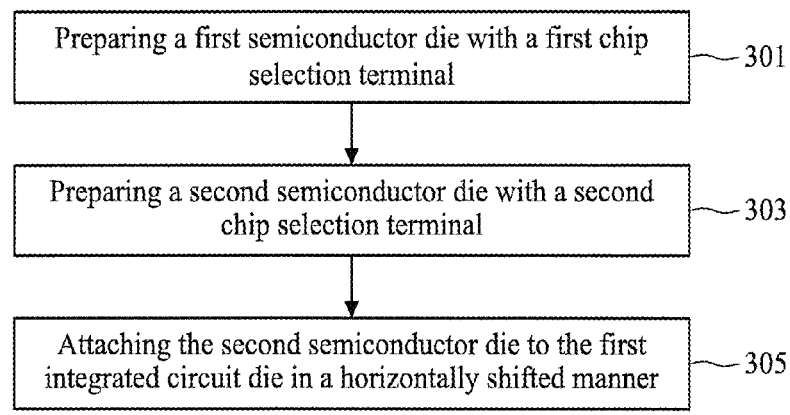
FIG. 5 is a flow chart of a method for preparing a semiconductor apparatus in accordance with some embodiments of the present disclosure.

FIG. 5 is a flow chart of a method for preparing a semiconductor apparatus in accordance with some embodiments of the present disclosure. In some embodiments, the semiconductor apparatus can be formed by a method 300 of FIG. 5. The method 300 includes a number of operations and the description and illustration are not deemed as a limitation as the sequence of the operations. The method 300 includes a number of steps (301, 303, and 305).

FIGS. 6 to 13 are schematic views of a process for preparing the semiconductor apparatus by the method of FIG. 5 in accordance with some embodiments of the present disclosure. In step 301, a first semiconductor die 110A with a first chip selection terminal 1109A is provided as shown in FIGS. 6 to 10.

Figure 6:
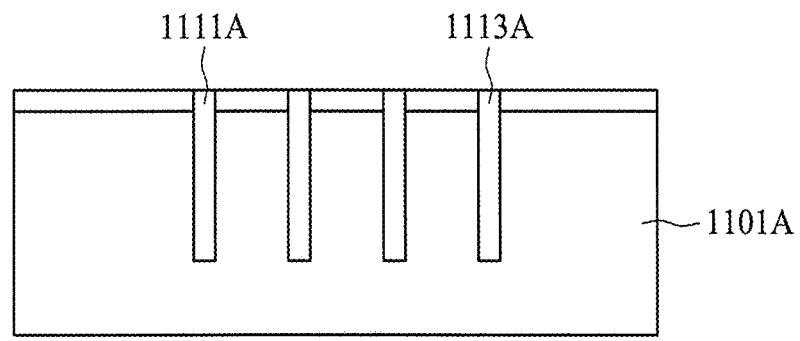
FIGS. 6 to 13 are schematic views of a process for preparing the semiconductor apparatus by the method of FIG. 5 in accordance with some embodiments of the present disclosure.

In FIG. 6, a first chip selection plug 1111A and a plurality of connection plugs 1113A are formed in a substrate 1101A. In some embodiments, the formation of the first chip selection plug 1111A and the connection plugs 1113A includes performing lithographic and etching processes to form holes in the substrate 1101A, and then filling the holes with conductors. In some embodiments, tungsten (W) is used as the conductor, but other conductive materials may also be used.

Figure 7:
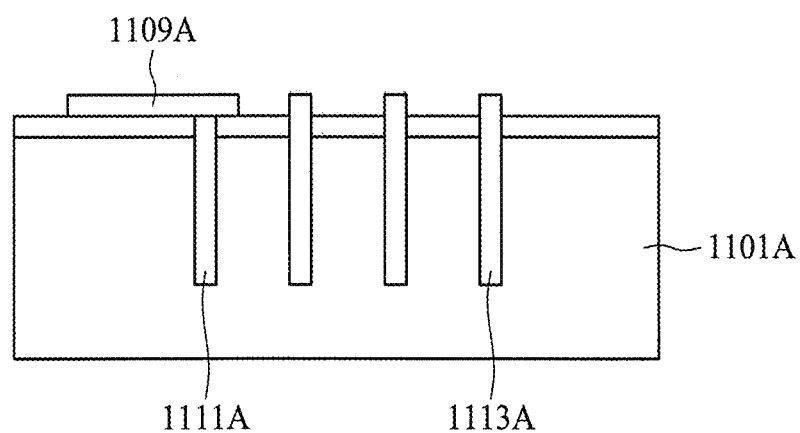

In FIG. 7, deposition, lithographic and etching processes are performed to form the first chip selection terminal 1109A on the first chip selection plug 1111A. In addition, the heights of the connection plugs 1113A are increased by the fabrication processes.

Figure 8:
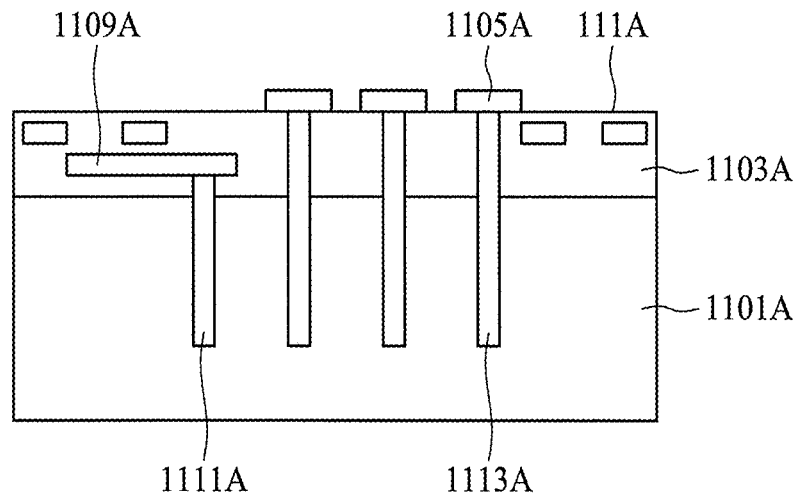

In FIG. 8, deposition, lithographic and etching processes are performed to form a circuit portion 1103A on the substrate 1101A and a plurality of first upper terminals 1105A on the connection plugs 1113A, wherein the first chip selection terminal 1109A is embedded in the circuit portion 1103A.

Figure 9:
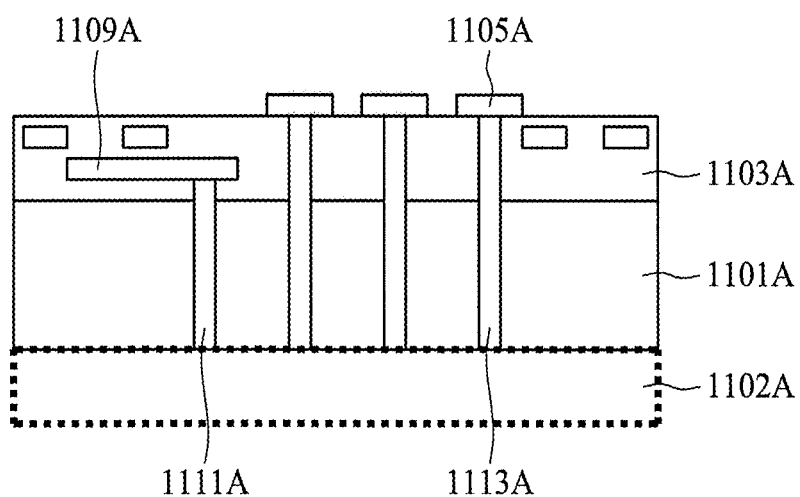

In FIG. 9, a grinding process is performed from a bottom side of the substrate 1101A to remove a bottom portion 1102A such that the bottom ends of the first chip selection plug 1111A and the connection plugs 1113A are exposed.

Figure 10:
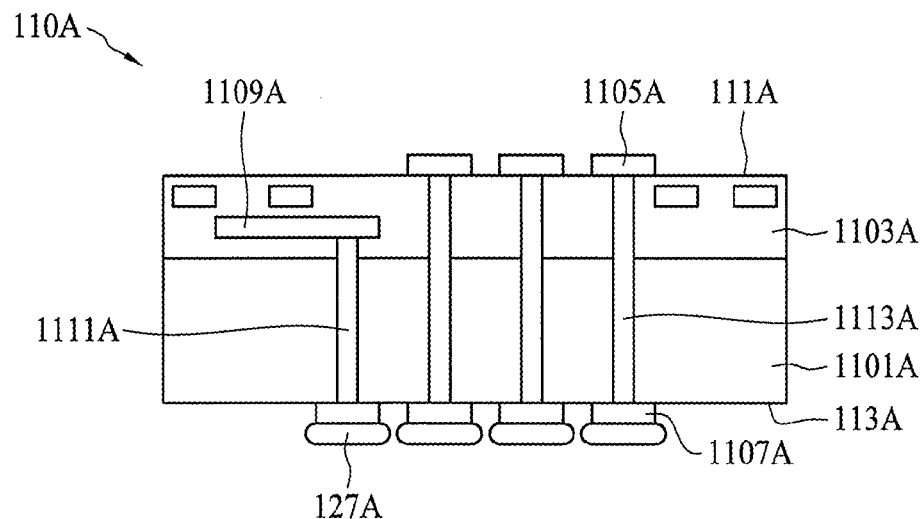

In FIG. 10, a plurality of lower terminals 1107A are formed on the bottom surface 113A, wherein one of the lower terminals 1107A is electrically connected to the first chip selection plug 1111A. Subsequently, several metal bumps 127A are formed on the lower terminals 1107A so as to complete the first semiconductor die 110A.

Figure 11:
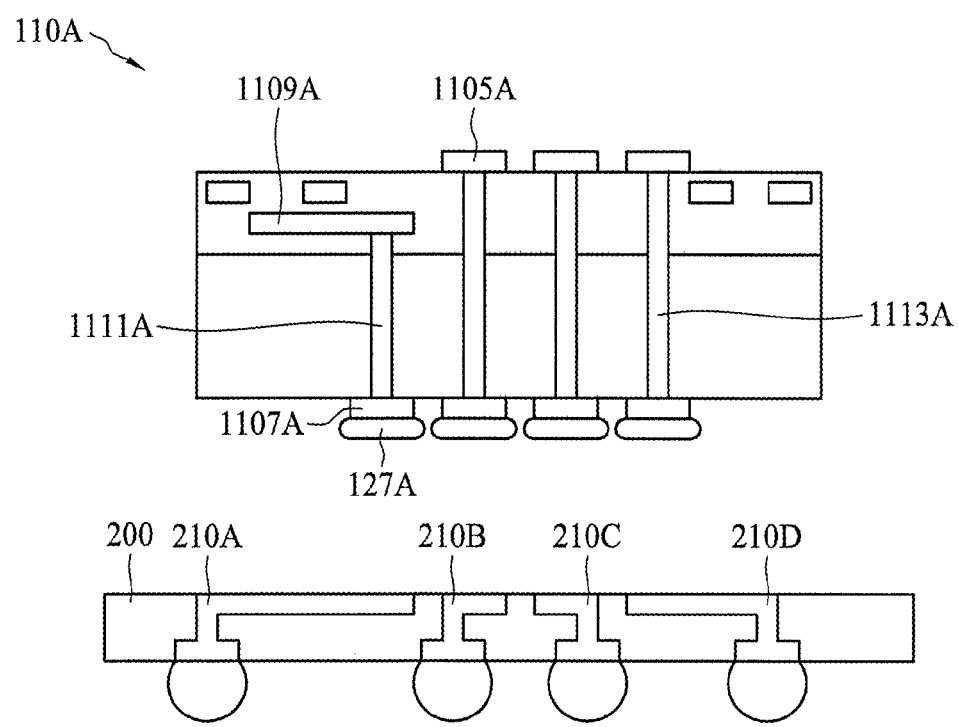

In FIG. 11, the first semiconductor die 110A is attached to an object 200 with a plurality of contacts 210A, 210B, 210C and 210D, wherein the first chip selection terminal 1109A is electrically connected to the contact 210A via the first chip selection plug 1111A, one of the lower terminals 1107A and one of the metal bumps 127A.

Figure 12:
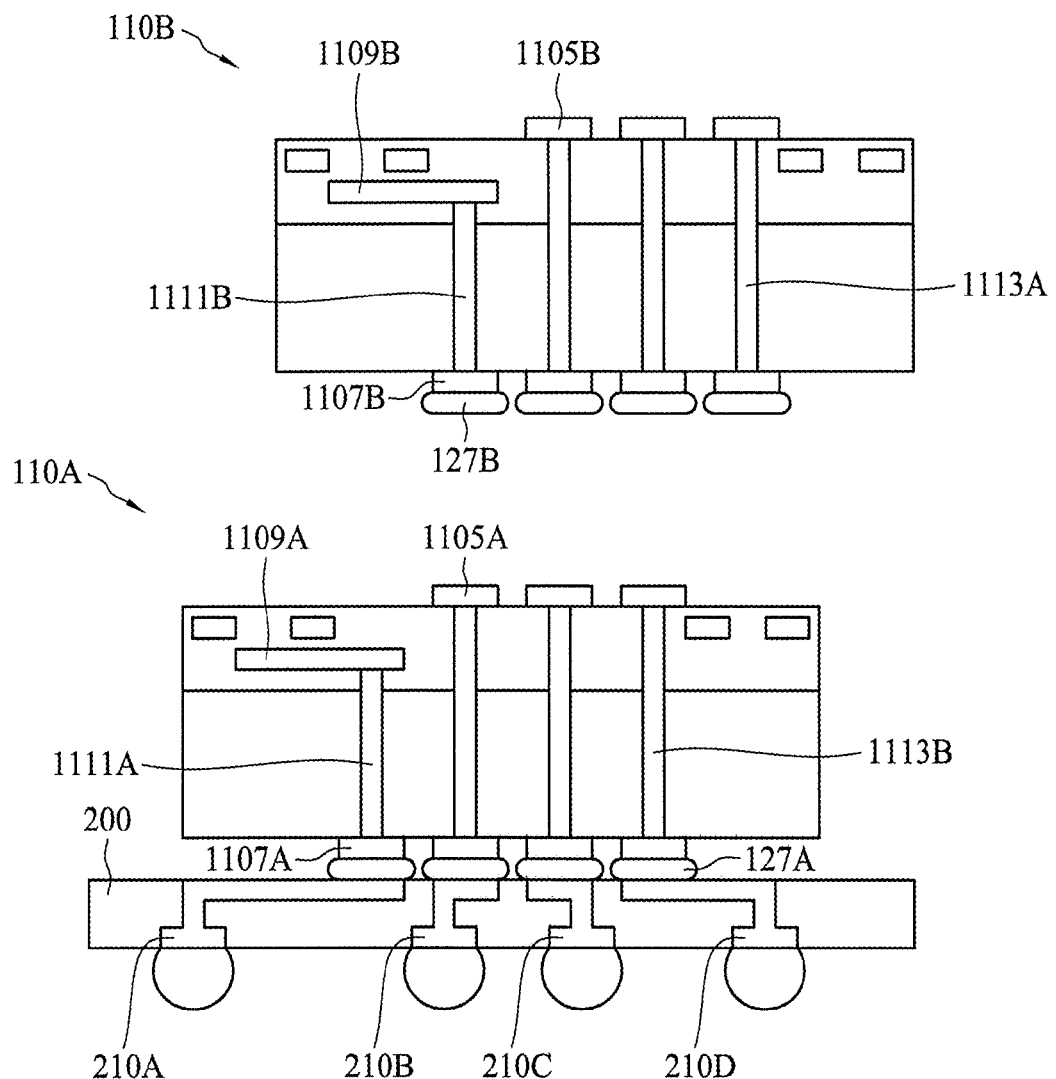

In step 302, as shown in FIG. 12, a second semiconductor die 110B with a second chip selection terminal 1109B is provided, wherein the second semiconductor die 110B comprises a second lower terminal 1107B electrically connected to the second chip selection terminal 1109B via a second chip selection plug 1111B. In some embodiments, the fabrication of the second semiconductor die 110B may be the same as that of the first semiconductor die 110A shown in FIGS. 6 to 10.

In step 303, the second semiconductor die 110B is stacked onto the first semiconductor die 110A in a horizontally shifted manner. The upper terminal 1105A (and the corresponding lower terminal 1107A) of the first semiconductor die 110A which is electrically connected to the second chip selection terminal 1109B of the second semiconductor die 110B is not electrically connected to the lower terminal 1107A which is electrically connected to the first chip selection terminal 1109A of the first semiconductor die 110A; consequently, the second chip selection terminal 1109B is electrically isolated from the first chip selection terminal 1109A. In other words, the first chip selection terminal 1109A and the second chip selection terminal 1109B are electrically connected to different lower terminals 1107A of the first semiconductor die 110A and different contacts of the object 200.

Figure 13:
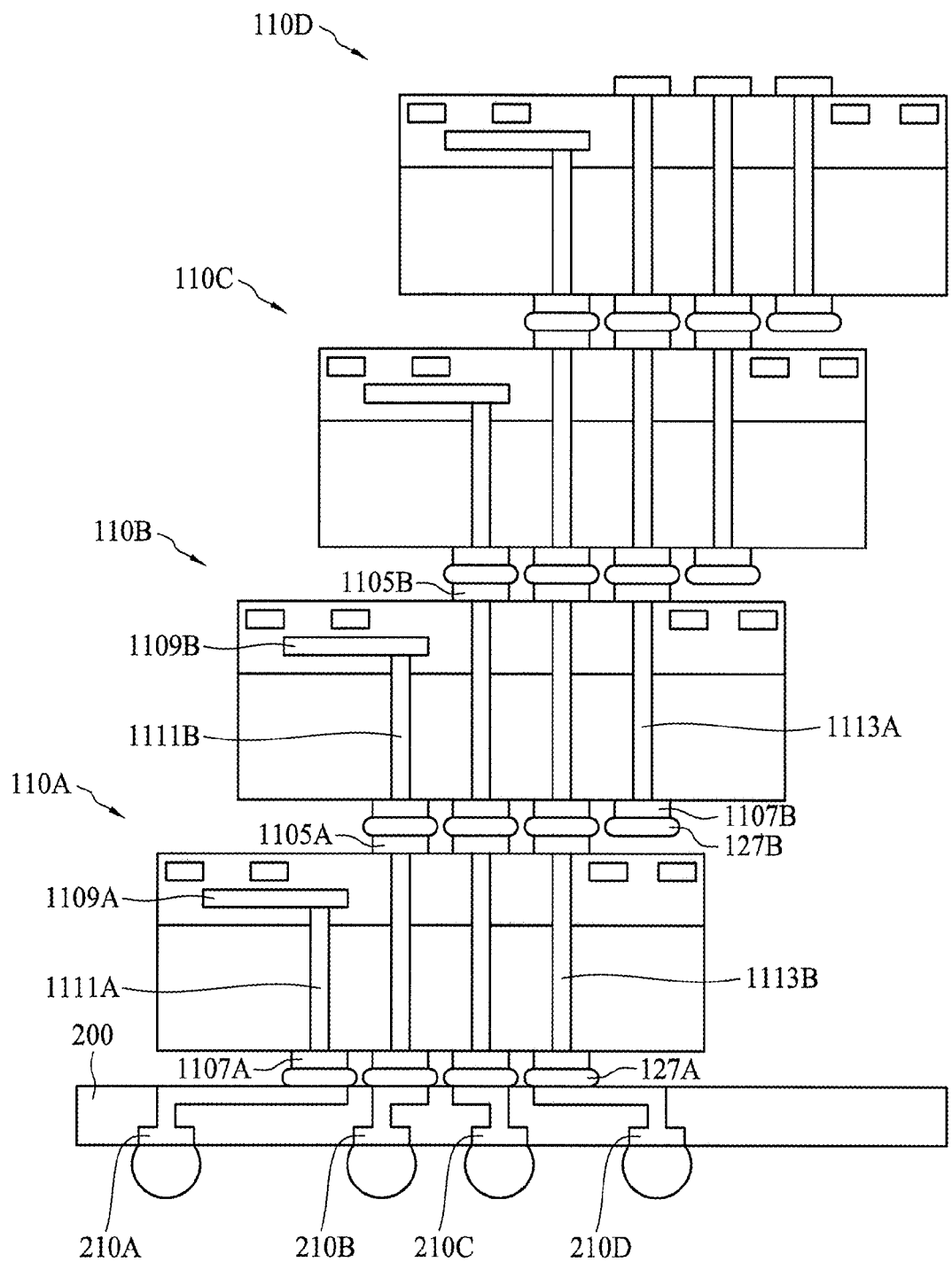

In addition, referring to FIG. 13, a third semiconductor die 110C is prepared and attached to the second semiconductor die 110B, a fourth semiconductor die 110D is prepared and attached to the third semiconductor die 110C, and more semiconductor dies may be prepared and attached to the fourth semiconductor die 110D in a horizontally staggered manner.

FIGS. 14 to 21 are schematic views of a process for preparing the semiconductor apparatus by the method of FIG. 5 in accordance with some embodiments of the present disclosure. In step 301, a first semiconductor die 110A' with a first chip selection terminal 1109A' is provided as shown in FIGS. 14 to 18.

Figure 14:
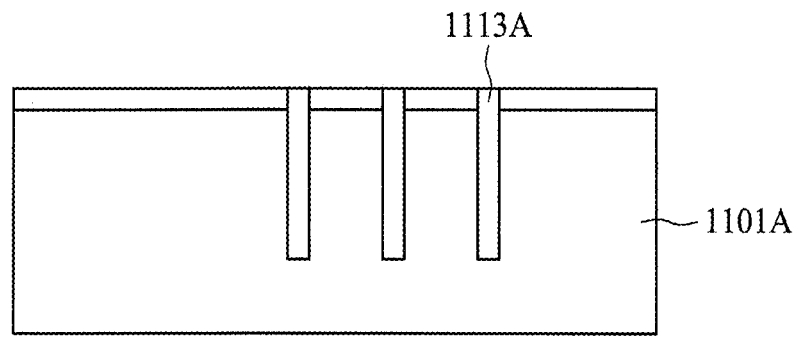
FIGS. 14 to 21 are schematic views of a process for preparing the semiconductor apparatus by the method of FIG. 5 in accordance with some embodiments of the present disclosure.

In FIG. 14, a plurality of connection plugs 1113A are formed in a substrate 1101A. In some embodiments, the formation of the connection plugs 1113A includes performing lithographic and etching processes to form holes in the substrate 1101A, and then filling the holes with conductors. In some embodiments, tungsten (W) is used as the conductor, but other conductive materials may also be used.

Figure 15:
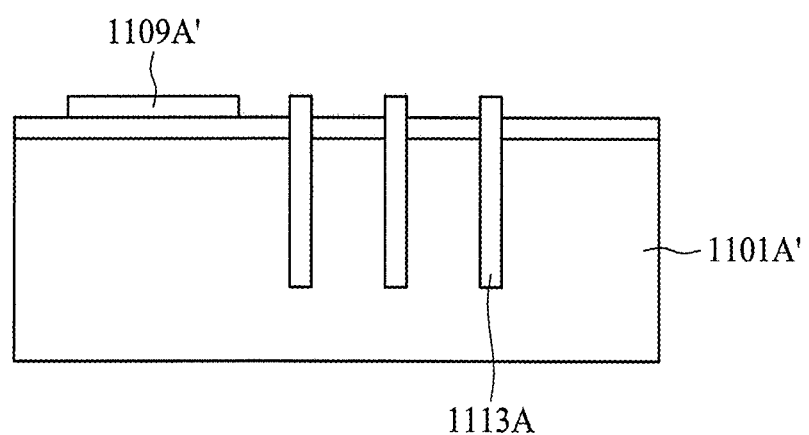

In FIG. 15, deposition, lithographic and etching processes are performed to form a first chip selection terminal 1109A' on the substrate 1101A'. In addition, the heights of the connection plugs 1113A are increased by the fabrication processes.

Figure 16:
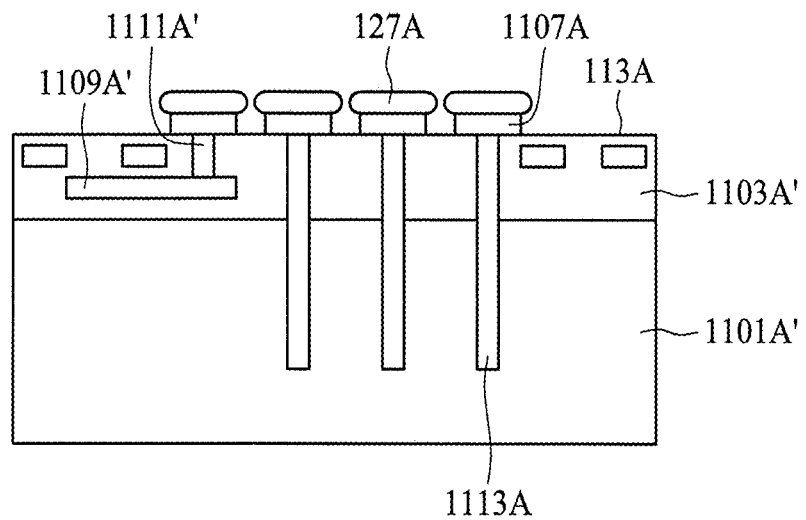

In FIG. 16, deposition, lithographic and etching processes are performed to form a circuit portion 1103A' with a first chip selection plug 1111A' on the substrate 1101A', and a plurality of lower terminals 1107A are then formed on the bottom surface 113A, wherein one of the lower terminals 1107A is electrically connected to the first chip selection plug 1111A'. Subsequently, a plurality of metal bumps 127A are formed on the lower terminals 1107A.

Figure 17:
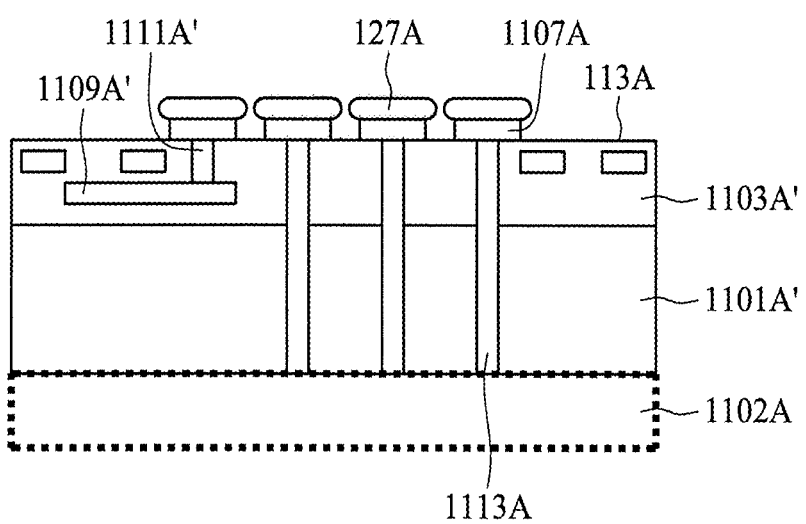

In FIG. 17, a grinding process is performed from a bottom side of the substrate 1101A' to remove a bottom portion 1102A such that the bottom ends of the connection plugs 1113A' are exposed.

Figure 18:
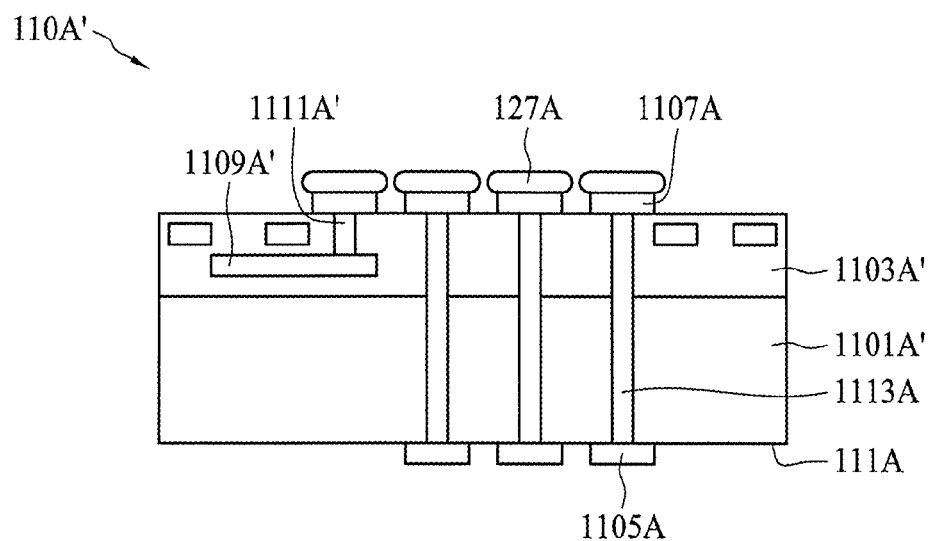

In FIG. 18, a plurality of upper terminals 1105A are formed on the connection plugs 1113A so as to complete the first semiconductor die 110A'.

Figure 19:
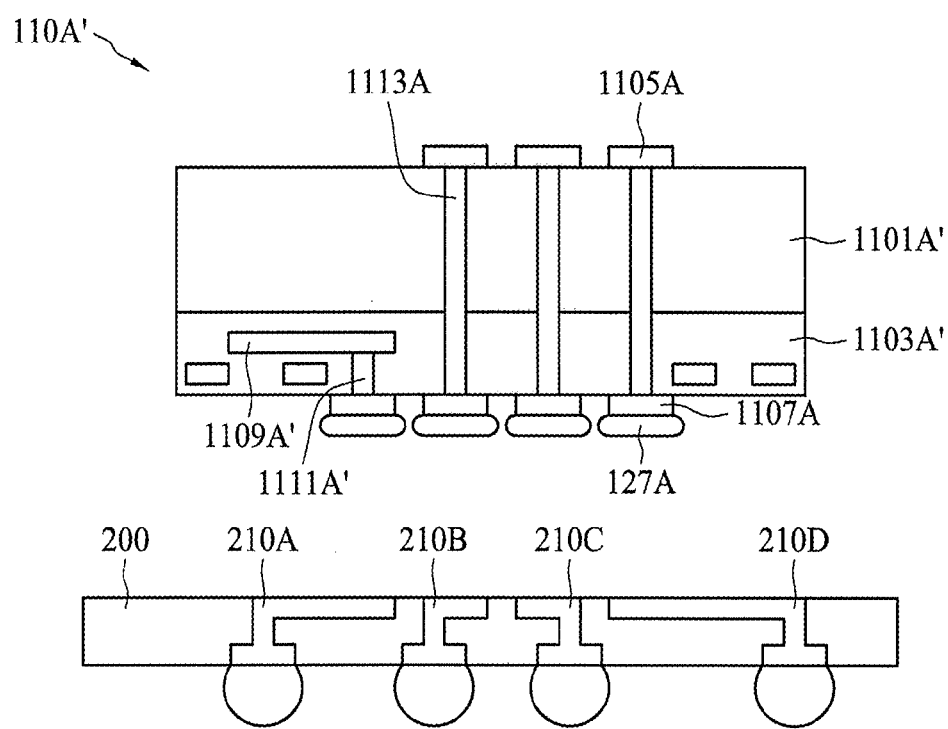

In FIG. 19, the first semiconductor die 110A' is turned upside-down and attached to an object 200 with a plurality of contacts 210A, 210B, 210C and 210D, wherein the first chip selection terminal 1109A' is electrically connected to the contact 210A via the first chip selection plug 1111A', one of the lower terminals 1107A and one of the metal bumps 127A.

Figure 20:
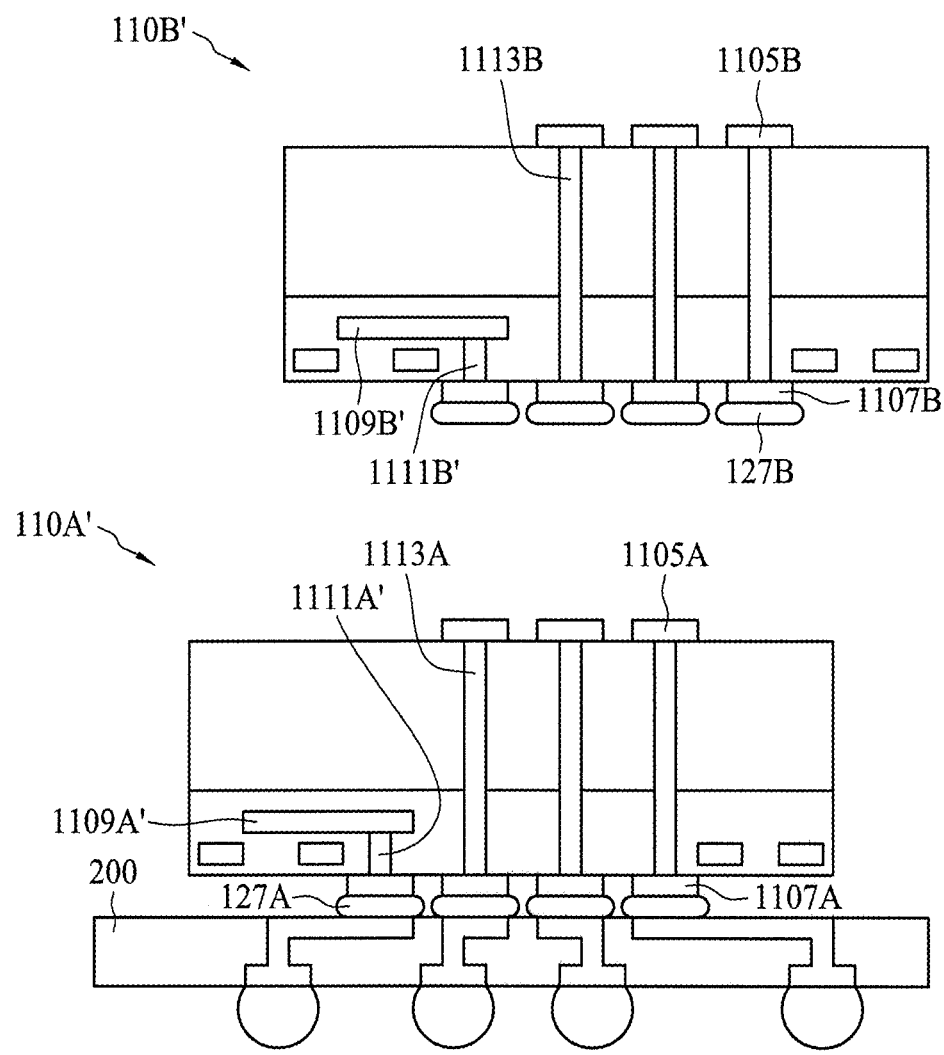

In step 302, as shown in FIG. 20, a second semiconductor die 110B' with a second chip selection terminal 1109B' is provided, wherein the second semiconductor die 110B' comprises a second lower terminal 1107B electrically connected to the second chip selection terminal 1109B' via a second chip selection plug 1111B'. In some embodiments, the fabrication of the second semiconductor die 110B' may be the same as that of the first semiconductor die 110A' shown in FIGS. 14 to 19.

In step 303, the second semiconductor die 110B' is stacked onto the first semiconductor die 110A' in a horizontally shifted manner. The upper terminal 1105A (and the corresponding lower terminal 1107A) of the first semiconductor die 110A' which is electrically connected to the second chip selection terminal 1109B' of the second semiconductor die 110B' is not electrically connected to the lower terminal 1107A which is electrically connected to the first chip selection terminal 1109A' of the first semiconductor die 110A'; consequently, the second chip selection terminal 1109B' is electrically isolated from the first chip selection terminal 1109A'. In other words, the first chip selection terminal 1109A' and the second chip selection terminal 1109B' are electrically connected to different lower terminals 1107A of the first semiconductor die 110A' and different contacts of the object 200.

Figure 21:
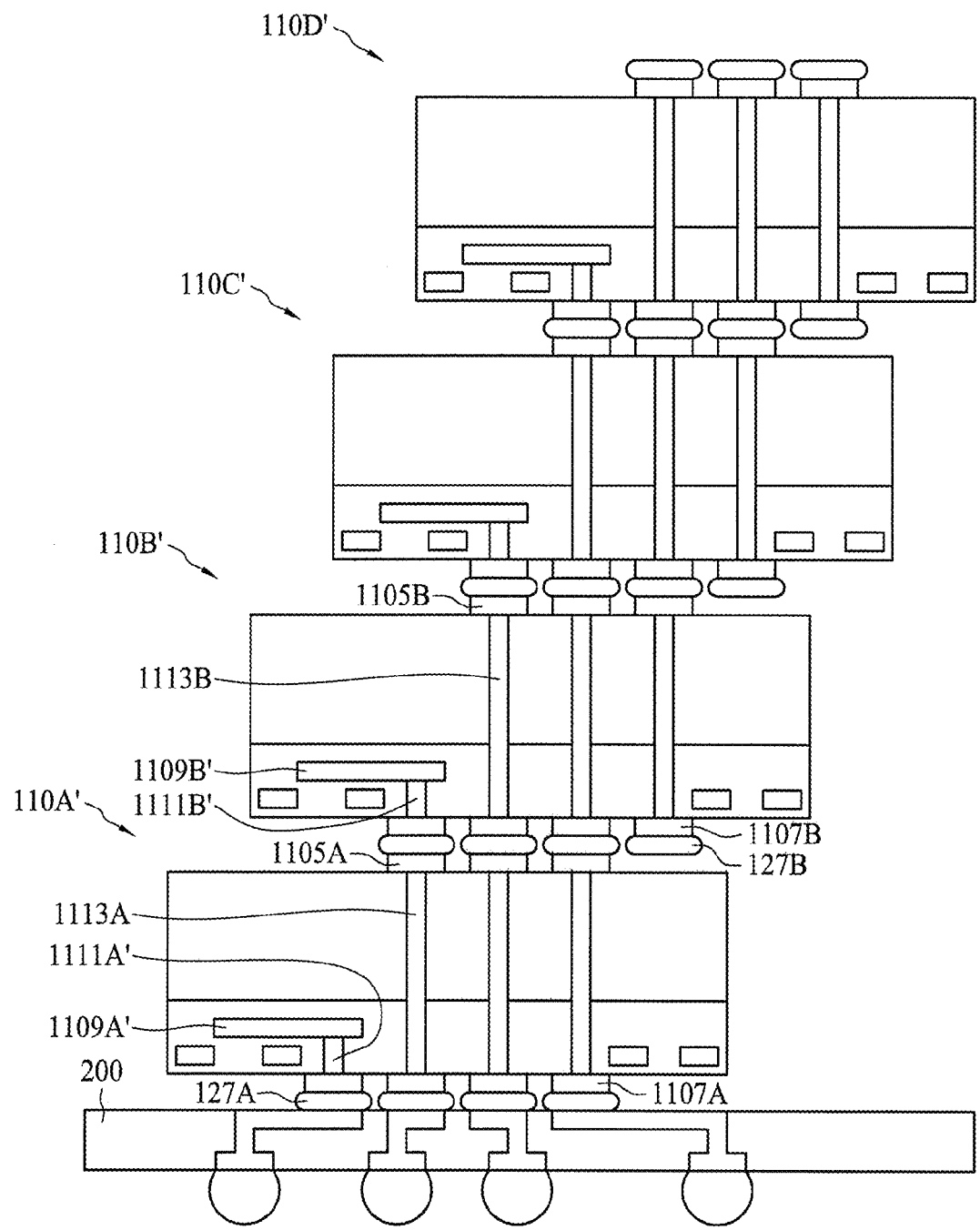

In addition, referring to FIG. 21, a third semiconductor die 110C' is prepared and attached to the second semiconductor die 110B', a fourth semiconductor die 110D' is prepared and attached to the third semiconductor die 110C', and more semiconductor dies may be prepared and attached to the fourth semiconductor die 110D' in a horizontally shifted manner.

The present disclosure is directed to a semiconductor apparatus having a plurality of horizontally shifted semiconductor dies and a method for preparing the same. The chip selection terminals of the plurality of horizontally shifted semiconductor dies are electrically isolated from each other; consequently, electronic signals can be selectively transmitted to a one of the semiconductor dies, while other semiconductor dies in the semiconductor apparatus cannot be accessed.

One embodiment of the present disclosure provides a semiconductor apparatus including a first semiconductor die and a second semiconductor die stacked onto the first semiconductor die in a horizontally shifted manner. The first semiconductor die includes a first chip selection terminal and a first lower terminal electrically connected to the first chip selection terminal. The second semiconductor die includes a second chip selection terminal electrically connected to a first upper terminal of the first semiconductor die via a second lower terminal of the second semiconductor die. The first upper terminal electrically connected to the second chip selection terminal is not electrically connected to the first lower terminal electrically connected to the first chip selection terminal.

Another embodiment of the present disclosure provides a method for preparing a semiconductor apparatus, including: preparing a first semiconductor die with a first chip selection terminal, wherein the first semiconductor die comprises a first lower terminal electrically connected to the first chip selection terminals; preparing a second semiconductor die with a second chip selection terminal, wherein the second semiconductor die comprises a second lower terminal electrically connected to the second chip selection terminal; and attaching the second semiconductor die to the first semiconductor die in a horizontally shifted manner. The second lower terminal is electrically connected to a first upper terminal of the first semiconductor die, and the first upper terminal which is electrically connected to the second chip selection terminal is not electrically connected to the first lower terminal which is electrically connected to the first chip selection terminal.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor apparatus, comprising:
    a first semiconductor die, comprising:
        a substrate;
        a circuit portion disposed on the substrate;
        a first chip selection terminal disposed in the circuit portion above or below the substrate; and
        a first lower terminal electrically connected to the first chip selection terminal; and
    a second semiconductor die stacked onto the first semiconductor die in a horizontally shifted manner, the second semiconductor die comprising a second chip selection terminal electrically connected to a first upper terminal of the first semiconductor die via a second lower terminal of the second semiconductor die,
    wherein the first upper terminal which is electrically connected to the second chip selection terminal is not electrically connected to the first lower terminal which is electrically connected to the first chip selection terminal.

2. The semiconductor apparatus of claim 1, wherein the first semiconductor die comprises a plurality of first upper terminals, a plurality of first lower terminals and a plurality of first connection plugs electrically connecting the first upper terminals and the first lower terminals, and
    wherein the second semiconductor die comprises a plurality of second upper terminals, a plurality of second lower terminals and a plurality of second connection plugs electrically connecting the second upper terminals and the second lower terminals.

3. The semiconductor apparatus of claim 2, wherein the first semiconductor die comprises a first chip selection plug electrically connecting the first chip selection terminal and one of the first lower terminals.

4. The semiconductor apparatus of claim 3, wherein the first chip selection plug is neither aligned with nor electrically connected to one of the second connection plugs of the second semiconductor die.

5. The semiconductor apparatus of claim 3, wherein the second semiconductor die comprises a second chip selection plug electrically connecting the second chip selection terminal and one of the second lower terminals.

6. The semiconductor apparatus of claim 5, wherein the second chip selection plug is aligned with and electrically connected to one of the first connection plugs of the first semiconductor die.

7. The semiconductor apparatus of claim 2, wherein the first chip selection terminal is disposed over the substrate and the first chip selection plug penetrates the substrate to contact one of the first lower terminals.

8. The semiconductor apparatus of claim 2, wherein the first chip selection plug penetrates the substrate, and the first connection plugs penetrate the substrate and the circuit portion.

9. The semiconductor apparatus of claim 2, wherein the first chip selection terminal is disposed below the substrate and the first chip selection plug contacts one of the first lower terminals without extending into the substrate.

10. The semiconductor apparatus of claim 2, wherein the first chip selection plug does not extend into the substrate, and the first connection plugs penetrate the substrate and the circuit portion.

11. The semiconductor apparatus of claim 2, wherein the first connection plug is aligned with and electrically connected to one of the second connection plugs directly above the first connection plug.

12. The semiconductor apparatus of claim 2, wherein at least one of second lower terminals is not electrically connected to the first upper terminals.

13. The semiconductor apparatus of claim 2, wherein the number of the first upper terminals is different from the number of the first lower terminals.

14. The semiconductor apparatus of claim 2, wherein the number of the first upper terminals is smaller than the number of the first lower terminals by at least one terminal.

15. The semiconductor apparatus of claim 1, wherein the first semiconductor die and the second semiconductor die have the same width, and one side of the second semiconductor die is not aligned with one side of the first semiconductor die.

16. The semiconductor apparatus of claim 1, wherein the second semiconductor die extends laterally across a side of the first semiconductor die.

17. The semiconductor apparatus of claim 1, further comprising an object,
wherein the first semiconductor die is attached to the object.

18. The semiconductor apparatus of claim 17, wherein the object comprises a plurality of contacts, and the first chip selection terminal and the second chip selection terminal are electrically connected to different contacts of the object.

* * * * *